US007041366B2

(12) United States Patent
Miyanaga et al.

(10) Patent No.: US 7,041,366 B2
(45) Date of Patent: May 9, 2006

(54) POROUS SILICON NITRIDE CERAMICS AND METHOD FOR PRODUCING THE SAME

(75) Inventors: Michimasa Miyanaga, Itami (JP); Osamu Komura, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 178 days.

(21) Appl. No.: 10/415,823

(22) PCT Filed: Mar. 22, 2002

(86) PCT No.: PCT/JP02/02809

§ 371 (c)(1),
(2), (4) Date: May 2, 2003

(87) PCT Pub. No.: WO03/022780

PCT Pub. Date: Mar. 20, 2003

(65) Prior Publication Data

US 2004/0013861 A1   Jan. 22, 2004

(30) Foreign Application Priority Data

Sep. 4, 2001   (JP) .............................. 2001-267267
Jan. 16, 2002   (JP) ................................. 2002-6821

(51) Int. Cl.
B32B 3/26   (2006.01)
C04B 38/00   (2006.01)

(52) U.S. Cl. .............................. 428/304.4; 428/307.3; 428/209; 428/312.2; 428/313.3; 428/313.9; 428/314.4; 428/446; 428/698; 428/697; 428/702; 428/704; 264/665; 264/683; 264/489; 264/474; 264/417; 501/39; 501/53; 501/64; 501/80; 501/97.1; 501/97.2; 501/152; 501/154

(58) Field of Classification Search ............. 428/304.4, 428/307.3, 209, 312.2, 313.3, 313.9, 314.4, 428/446, 697–698, 704, 702, 426; 264/665, 264/683, 489, 474, 417; 501/39, 53, 64, 501/80, 97.1, 97.2, 152, 154
See application file for complete search history.

(56) References Cited

U.S. PATENT DOCUMENTS 3,258,349 A * 6/1966 Scott ........................... 523/218
6,197,243 B1 * 3/2001 Tiegs et al. .................. 264/432
6,800,360 B1 * 10/2004 Miyanaga et al. ........... 428/210

FOREIGN PATENT DOCUMENTS

| EP | 0 758 633 A1 | | 2/1997 |
|---|---|---|---|
| EP | 941976 | * | 9/1999 |
| JP | 63-209150 | * | 8/1988 |
| JP | 03-177372 | | 8/1991 |
| JP | 05-310469 | | 11/1993 |
| JP | 06-157157 | | 6/1994 |
| JP | 07-87226 | | 9/1995 |
| JP | 08-228105 | | 9/1996 |
| JP | 08-295576 | | 11/1996 |
| JP | 11-116333 | | 4/1999 |
| JP | P2001-172090 A | | 6/2001 |

OTHER PUBLICATIONS

Translation of JP-08-228105.*
Translation of JP-63-20915008.*
Translation of JP-63209150.*

* cited by examiner

*Primary Examiner*—Ling Xu
(74) *Attorney, Agent, or Firm*—McDermott Will & Emery LLP

(57) ABSTRACT

The invention provides porous silicon nitride ceramics that having uniform, fine closed pores and a manufacturing method thereof. Metal Si powder is mixed with a sintering additive, followed by thermal treatment, which is a pre-process for forming a specific grain boundary phase. Two-stage thermal treatment is thereafter performed by microwave heating at a temperature of 1000° C. or more. The metal Si powder is thereafter subjected to a nitriding reaction from its surface, the metal Si is thereafter diffused to nitride formed on the outer shell thereof such that porous silicon nitride ceramics having uniform, fine closed pores can be produced. Having a high ratio of closed pores and being superior in electrical/mechanical characteristics, the porous silicon nitride ceramics can display excellent characteristics if used, for example, for an electronic circuit board that requires an anti-hygroscopicity, a low dielectric constant, a low dielectric loss, and mechanical strength.

7 Claims, 3 Drawing Sheets

(a)

(b)

(c)

POROUS SILICON NITRIDE CERAMICS AND METHOD FOR PRODUCING THE SAME

TECHNICAL FIELD

This invention relates to porous silicon nitride ceramics used as dielectric materials, which are used for various wiring circuit boards, insulating members, or radio-wave transmission materials, or used as lightweight, anti-hygroscopic structural materials, and relates to a manufacturing method thereof.

BACKGROUND ART

Ceramics are materials used as various structural materials and electronic-parts materials, and, in recent years, demands have been made to improve its characteristics, i.e., to further reduce the weight, to increase the strength, and to upgrade the electrical characteristics. For example, in a wafer transporting stage and a drawing stage that are each used as a semiconductor manufacturing device component, stage materials are required to further reduce their weights for high accuracy and high-speed driving. Additionally, a circuit board and insulating material that are used for electronic equipment strongly require materials that are smaller in permittivity and in dielectric loss in accordance with the latest developments of frequency heightening.

A possible and useful solution for satisfying the requirements is to use ceramics in the form of porous ceramics. For example, if the relative density of ceramics is reduced to 50%, the weight thereof can be reduced by 50%. Additionally, air, whose permittivity is about 1 and whose dielectric loss is 0, exhibits excellent electric nonconductivity, and therefore porous ceramics can have desirable characteristics as a material for which a low dielectric constant and a low dielectric loss are needed.

However, it is difficult to obtain, merely by controlling a sintering process of the ceramic sintered body, a porous sintered body in which fine pores are uniformly dispersed. Normally, a situation occurs in which its strength is weakened or its characteristics become uneven because of the generation of coarse pores. In addition, there has been a problem in the fact that, since most pores of a resulting porous sintered body are open pores, moisture resistance inherent in ceramics is impaired, and a marked deterioration in electrical characteristics (permittivity and dielectric loss) caused by water or unevenness in various characteristics occurs and, as a result, desired characteristics cannot be practically obtained.

Therefore, various techniques have been developed for obtaining porous materials that have fine closed pores. For example, Japanese Unexamined Patent Publication No. H3-177372 discloses an SiC-based porous sintered body in which the volume ratio obtained when closed pores are totaled is 0.07 to 27.5% by containing different phases in a thermal expansion coefficient, with the aim of improving toughness. However, a problem with this technique is that oxidation resistance will decrease, or a pore diameter will increase if an attempt is made to obtain an SiC-based porous sintered body that has 27.5% or more closed pores.

Japanese Unexamined Patent Publication No. H5-310469 discloses a high-purity calcia sintered body whose pore diameter is 2 to 10 µm and whose closed porosity is 5 to 15%. According to this publication, in order to obtain the sintered body, a foaming agent, such as phenol aldehyde, or combustible fine powder, such as carbon black, is mixed with a slurry of calcium carbonate and water, and these are burned. However, a problem with this method is that the closed porosity cannot be heightened because residues of the foaming agent or the combustible fine powder exist in closed pores, and the increase in the foaming agent makes it difficult to maintain its shape.

Japanese Unexamined Patent Publication No. H6-157157 discloses lightweight high-strength ceramics in which closed pores are formed by balancing the pressure of the closed pores in the ceramics with the pressure in a burning furnace. However, a problem in this method is that it is difficult to control the pore diameter and difficult to obtain high porosity.

Japanese Examined Patent Publication No. H7-87226 discloses a method for obtaining ceramics that have fine closed pores by mixing ceramics with grainy resin and by burning them. However, according to this method, although the grainy resin is sublimed and burned so as to form closed pores, the grainy resin remains in the ceramics, or the combustion gas of the grainy resin is adsorbed to the inner surface of the dosed pores, thereby decreasing its electrical characteristics. Another problem in this method is the fact that it is difficult to form a complete closed pore even if it is an independent pore in appearance, and an additional contrivance is needed to obtain airtightness.

Japanese Unexamined Patent Publication No. H11-116333 discloses a method for manufacturing a ceramic circuit board, by green-sheet-laminating technique, from a compound of glass/aggregate/resinous-balls that is prepared using porous glass aggregate obtained by the crystallization/heat treatment of porous glass. In the method, the porous glass is prepared by subjecting borosilicate glass to thermal treatment for phase splitting to elute a soluble phase, and then grinding, and melting only the surface so as to form closed pores of a nanometer order. The dielectric constant of the ceramic circuit board obtained by this method is 2 or less, and the thermal expansion coefficient thereof is 13 to 17 ppm/° C. According to this method, materials are limited to those in which phase splitting is performed by thermal treatment, and a soluble phase is eluted. Additionally, not only is the process complicated, but also materials need to be used while being complexed into different phases, and therefore the inherent mechanical, electrical characteristics cannot be obtained. Still another problem in this method is that, once open pores are exposed to the atmosphere and water is adsorbed, it is difficult to completely dissociate and control this.

As described above, the conventional methods for forming closed pores require an addition of a second phase different from a matrix phase, such as a foaming agent, melting substance, or a phase different in the thermal expansion coefficient, and therefore, electrical/mechanical characteristics greatly and disadvantageously decrease because of the second phase or because of the residues of the second phase. Additionally, since the heightening of porosity makes it impossible to form a matrix frame or impossible to control the pore diameter, there is a limit to the porosity and the pore diameter that can be formed.

DISCLOSURE OF INVENTION

The present invention has been developed to resolve the aforementioned problems. That is, it is an object of the present invention to provide porous silicon nitride ceramics that have uniform fine closed pores and provide a manufacturing method thereof.

The porous silicon nitride ceramics of the present invention are less than 70% in relative density and are 50% or more in the ratio of closed pores to all pores. Preferably, they are less than 50% in relative density, and are 90% or more in the ratio of closed pores to all pores.

In normal porous ceramics, pores exist between particles as shown schematically in FIG. 2. In contrast, in the porous silicon nitride ceramics of the present invention, a particle has a hollow structure as shown schematically in FIG. 1, and therefore a structure in which dense portions (skeletal portions) are connected like a network is formed. In addition, since coarse pores are not included, mechanical strength and electrical characteristics superior to conventional porous ceramics are provided. Especially, in porous ceramics structured such that pores having uniform diameters are dispersed because the particles are hollowed, radii r1 and r2 of two adjoining pores and width b of a ceramic part can have a relation (r1+r2)/b>1 in an arbitrary section of the porous ceramics. Preferably, (r1+r2)/b>2.

The porous silicon nitride ceramics of the present invention contain an oxynitride or siliconoxynitride compound crystal phase expressed by $RE_4Si_2N_2O_7$ or $RE_{10}N_2(SiO_4)_6$, wherein RE is a rare earth metal. In a ceramic circuit board of the present invention, at least a part of insulating layers consist of the porous ceramics.

A porous silicon nitride ceramic of the present invention can be obtained by a manufacturing method in which a molded piece containing metal Si powder and at least one of Yb, Sm, and Er of 0.2 to 2.5 mol % with respect to the metal Si powder is formed, and thereafter is subjected to thermal treatment in an atmosphere that contains nitrogen. Porous silicon nitride ceramics that consist of silicon nitride ceramic particles that have been hollowed can be obtained by subjecting the molded piece to thermal treatment under microwave irradiation or millimeter-wave irradiation.

BEST MODE FOR CARRYING OUT THE INVENTION

Figure 1:
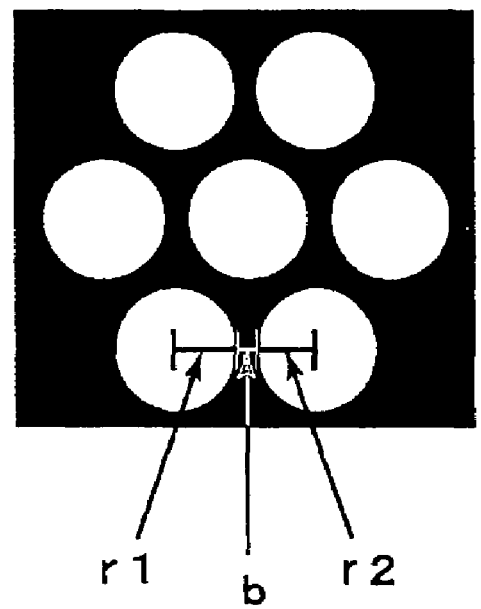
FIG. 1 is a schematic view of the sectional structure of porous ceramics of the present invention.
Figure 2:
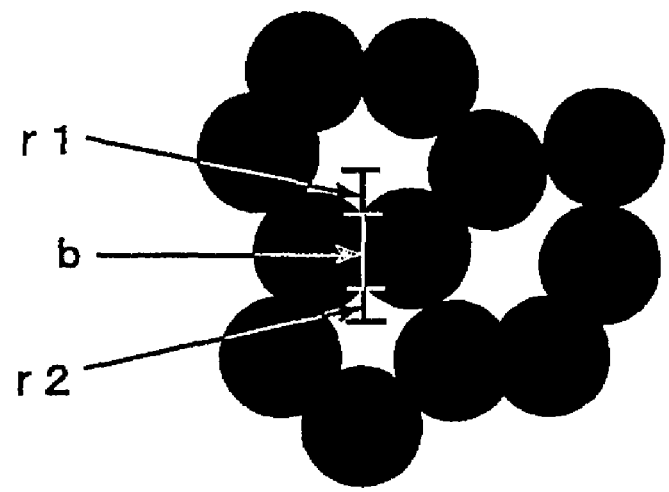
FIG. 2 is a schematic view of the sectional structure of conventional porous ceramics.

A detailed description of the porous silicon nitride ceramics of the present invention will hereinafter be given while referring to a manufacturing method thereof. The porous silicon nitride ceramics of the present invention can be obtained according to a method that includes a step of preparing metal Si powder and sintering-aid powder, a step of mixing these powders together so as to make a mixed powder, a step of molding the mixed powder so as to form a molded piece, and a step of sintering the molded piece under an atmosphere in the presence of nitrogen and forming a sintered body of metal nitride. Closed pores are obtained by hollowing the metal Si powder. A relative density and the ratio of closed pores to all pores can be controlled by the particle size of the metal Si powder that is a starting material.

A commercially available metal powder of high purity can be used as the metal Si powder. However, a natural oxide film or a thermal oxide film resulting from subsequent thermal treatment is formed on the surface of the metal Si powder. Since the degree of hollowness varies remarkably depending on the amount of these oxide films, it is important to control the oxygen content of the metal Si powder and the composition of a grain boundary phase that depends on the oxygen content. Preferably, the oxygen content in the range of 0.2 mol % to 1.0 mol % in terms of a metallic oxide ($SiO_2$) is selected. In addition, it is important to restrain an increase in the oxygen content of the mixture by adding a coupling agent or a similar agent or, alternatively, restrain an increase in the oxygen content thereof by adding a reducing agent, such as phenol resin.

Preferably, the average particle diameter of the metal Si powder is not less than 0.1 μm and not more than 15 μm. If it is less than 0.1 μm, it becomes difficult to control the oxygen content because the specific surface area is large, and, if it is 15 μm or more, a longer reaction time is needed for achieving complete hollowness, which is uneconomical.

A compound, such as oxide, oxynitride, or silicide of at least one of Yb, Sm, and Er, is added, as a sintering additive, to the metal Si powder. Preferably, an oxide of Yb or Sm is added. Preferably, the added amount to the metal Si powder is 0.2 mol % to 2.5 mol %. If it is less than 0.2 mol %, the diffusion of metal Si is not facilitated and the hollowness of Si particles is not satisfactorily performed. If it is 2.5 mol % or more, total porosity tends to decrease. In the present invention, $Fe_2O_3$ or $Al_2O_3$, which is conventionally known as a nitrization-accelerating agent of metal Si, is undesirable because sufficient hollowness is not achieved.

Preferably, the average particle diameter of the sintering additive to be added is 0.1 μm to 1 μm. If it is less than 0.1 μm, cohesion easily occurs such that treatment becomes difficult, and, if it exceeds 1 μm, the metal powder has difficulty in the progression of a nitriding reaction. In a case where the oxide film on the surface of the metal powder disturbs the reaction, it is preferable to add an alkali metal, an alkaline earth metal, or an oxide of these metals as a second sintering additive besides the aforementioned sintering additive. Preferably, the amount of addition of the second sintering additive is 0.1 mol % to 1.5 mol %, and the average particle diameter thereof is 0.1 μm to 2 μm.

The metal Si powder, the sintering additive, and, if necessary, an organic binder are added and mixed together according to a known ball mill method or an ultrasonic-wave mixture method. After mixing them, they are dried. Thereafter, they are molded into a predetermined shape, and a molded piece is obtained. Molding can be performed according to a known molding method, such as a dry pressing molding method, an extrusion molding method, a doctor blade molding method, and an injection molding method, and, from the viewpoint of quality and production, a most preferable molding method can be selected in accordance with a desired shape. A mixed powder after the mixture can also be formed to be granular prior to molding, and the bulk density thereof can be pre-heightened so as to improve moldability. The organic binder is added when the moldability is to be more greatly improved.

The molded piece is subjected to thermal treatment in an atmosphere gas that contains nitrogen so as to form a specific grain boundary layer, and the nitriding reaction of metal Si is then advanced, and thereby each particle of the metal Si powder is hollowed, and adjoining nitrides of the metal Si powder that have reacted are unified, such that porous silicon nitride ceramics having fine closed pores can be obtained. The thermal treatment is performed in two stages of a pre-process for forming a specific grain boundary phase and a reaction process for performing hollowness while advancing the nitriding reaction.

The pre-process can be performed in, for example, a carbon heater furnace. The molded piece is subjected to thermal treatment for one hour or more at a temperature in the range of 800° C. or more and less than 1000° C. The atmosphere during the thermal treatment is a nitrogen atmosphere that contains an inert gas of 20 vol % or more. In this pre-process, there is a need to form a grain boundary phase represented as $RE_{10}N_2(SiO_4)_6$ or $RE_4Si_2N_2O_7$ where RE is Yb, or Sm, or Er. If such a grain boundary phase is not formed, the hollowness of an Si particle is not promoted in the following step, i.e., in the reaction process, thus making it difficult to obtain the porous silicon nitride ceramics of the present invention. Therefore, the composition of a sintering additive, the oxygen content of base powder, and the conditions of thermal treatment are adjusted in order to form such a grain boundary phase. If the preprocessing temperature is less than 800° C., the grain boundary phase cannot be formed. If it is 1000° C. or more, the nitriding reaction of metal Si is started in a state in which the grain boundary phase has not been sufficiently formed, and therefore it becomes difficult to obtain the porous silicon nitride ceramics to be sought. It is particularly preferable that the grain boundary phase is $RE_{10}N_2(SiO_4)_6$.

The reaction process which is thermal treatment at the second stage is performed in an atmosphere that contains $N_2$ or $NH_3$ at a temperature of 1000° C. or more. $H_2$ or He besides $N_2$ or $NH_3$ can be simultaneously put into the atmosphere. Heating can be performed in, for example, a carbon furnace; however, in order to promote the diffusion and hollowing of metal Si powder and to restrain the disappearance of a hollow structure caused by particle growth, it is preferable to use microwaves or millimeterwaves for thermal treatment. In particular, the heating is performed preferably by the microwave irradiation of a frequency of 20 GHZ or more, since the diffusion of a metal into metal nitride $(Si_3N_4)$ formed on the outer shell of the metal Si powder can thereby be further promoted, and accordingly the metal powder can easily be hollowed.

Preferably, the reaction-process temperature is 1000° C. or more. If it is less than 1000° C., the progression of the nitriding reaction of the metal powder slows, which is not economical. In the case of carbon-heater heating, the reaction-process temperature is preferably 1500° C. or less, and in the case of microwave heating, the preferable temperature is 1750° C. or less. If it exceeds these temperatures, the phase transformation of the metal nitride or the particle growth thereof occurs, and the hollow structure changes, thereby making it difficult to produce the porous ceramics of the present invention.

It is preferable to raise the temperature step by step, at two or more steps, to the maximum temperature. The reason is that the nitriding reaction of a metal is an exothermic reaction, and, if the temperature is raised to the final sintering temperature at one time, the temperature exceeds the melting point of the metal because of its own heat, and the metal begins to melt. If the metal melting occurs, an unreacted, melted mass is generated, and thereby coarse pores are generated, or elution from a molded piece begins, and a deterioration in the mechanical/electrical characteristics of the porous ceramics is caused.

Normally, thermal treatment is performed for two hours or more until the metal Si is completely changed into silicon nitride such that the metal Si disappears, but, according to a specific object, the duration of the thermal treatment can be intentionally shortened so that the metal Si remains, thereby making it possible to produce silicon nitride ceramics having a higher closed porosity.

Figure 3:
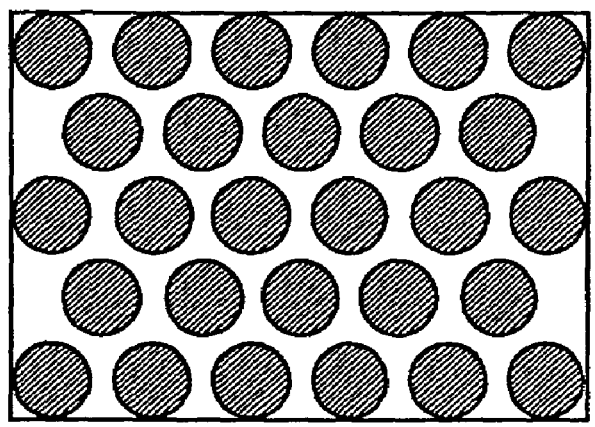
FIG. 3 shows a sintering process of the porous ceramics of the present invention, in which (a) is in a molded state, (b) is in an initial state of sintering, and (c) is in a completed state of sintering.
Figure 3:
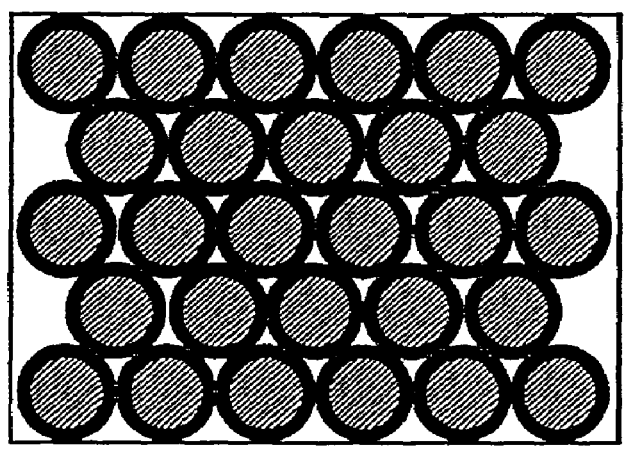
Figure 3:
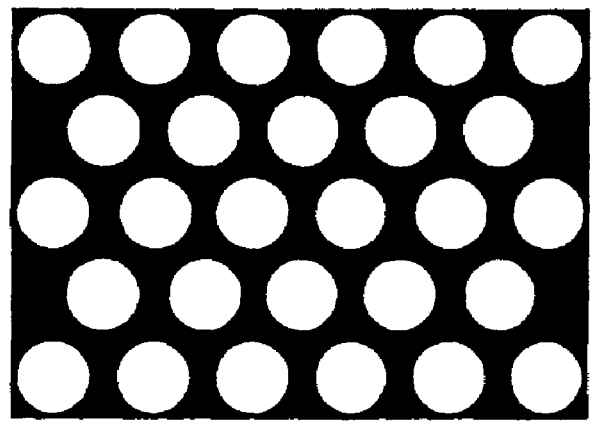
Figure 4:
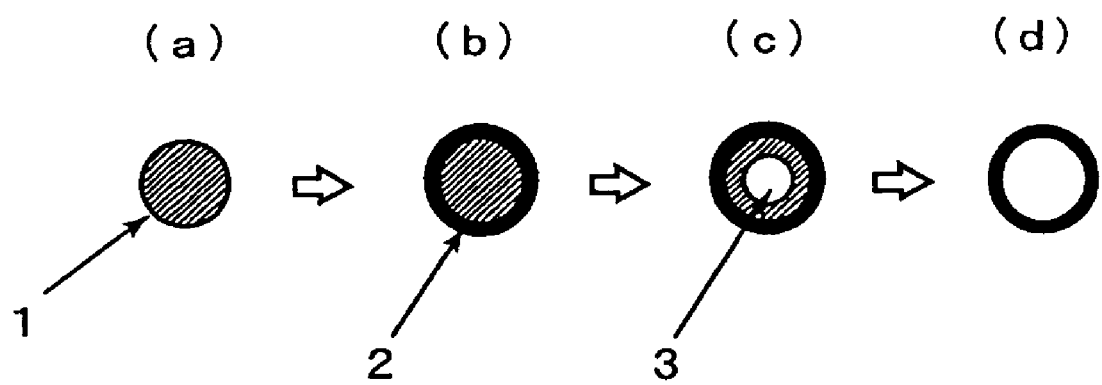
FIG. 4 schematically explains a change of one metallic particle in the sintering process of the porous ceramics of the present invention, in which (a) is in a state before sintering, (b) is in an initial state of sintering, (c) is in a progressing state of sintering, and (d) is in a completed state of sintering.

In the reaction process, the surface of the metal Si powder is first nitrided as shown schematically in FIGS. 3 and 4. When the reaction process is advanced, the metal diffuses to the outer-peripheral nitride side in the nitriding reaction, and it is presumed that the nitriding reaction progresses such that hollowing is performed. Therefore, finally, the part that has been occupied by the metal Si powder becomes porous. This diffusion to the nitride of the outer part of the metal Si is distinguished especially when the specific grain boundary layer mentioned above is formed. The degree of hollowness depends on the oxygen content of the metal Si powder which is a starting material, or depends on the kind of sintering additive, or depends on a thermal treatment method. Basically, the size of each individual closed pore depends on the particle size of the metal Si powder which is a starting material, and therefore, if the metal Si powder is uniform in particle diameter, the size of the closed pore is uniform, and coarse closed pores are never included. Preferably, the pressure of an atmosphere at the thermal treatment is 1 atm (101 kPa) to 5 atm (507 kPa) though it is not limited to a specific pressure.

In the porous ceramics of the present invention obtained as described above, each individual particle of the metal Si powder is hollowed such that a structure is formed in which pores having a uniform diameter are dispersed. Therefore, the porous silicon nitride ceramics are superior in antihygroscopicity, are small in permittivity, and are small in dielectric loss. The relative density is less than 70%, and the ratio of closed pores to all pores is 50% or more. Furthermore, by selecting the average particle diameter and oxygen content at the surface of raw material metal Si powder, the kind of sintering additive, and sintering conditions, the relative density can be made less than 50%, and the ratio of closed pores to all pores can be made 90% or more.

In an arbitrary section of the porous silicon nitride ceramics of the present invention, if the radii of adjoining pores are represented as r1 and r2, respectively, and the thickness of a ceramic part is represented as b, as shown in FIG. 1, the relation (r1+r2)/b>1 is established. In other words, the diameter of a pore can be made equal to or greater than the thickness of the ceramic part by selecting the average particle diameter, and oxygen content at the surface, of raw material metal Si powder, the kind of sintering additive, and the sintering conditions. Preferably, (r1+r2)/b>2. This structure makes it possible to further reduce the dielectric loss.

A preferable embodiment of the porous silicon nitride ceramics of the present invention has a dielectric loss of about $10^{-4}$ or less. As for a mechanical characteristic, the deflective strength by three-point bending is 200 MPa or more, and the porous silicon nitride ceramics are excellent in electrical/mechanical characteristics.

EXAMPLE 1

Si powder having an average particle diameter of 1 µm and, as a sintering additive, $Er_2O_3$ having an average particle diameter of 0.8 µm in the amount of 0.8 mol % with respect to the Si powder were prepared. Each powder is commercially available. The Si-powder, which was measured beforehand according to an inert-gas fusion and infrared detection method and confirmed to have the oxygen content of 0.7 mol % at the surface thereof in terms of $SiO_2$, was prepared. Each powder that has been prepared was subjected to ball-mill mixing for 24 hours with ethyl alcohol as a solvent. At this time, octyl triethoxysilane of 4 wt % was added as an oxidation inhibitor. After the mixture, it was naturally dried, and, using a dry press, it was molded to have a size of 23 mm in diameter, 3 mm in height, 4.5 mm in length, 7 mm in width, and 4.5 mm in height.

In a nitrogen atmosphere (30 vol % Ar-70 vol % $N_2$) that includes 30 vol % Ar of atmospheric pressure, this molded piece was held at 950° C. for one hour by the microwave heating of a frequency of 28 GHZ. Thereafter, the atmosphere was changed to the nitrogen atmosphere of atmospheric pressure, and a reaction process was performed under the conditions of Table I. Herein, "1200*3+1400*3" indicates that it was held for three hours at 1200° C., and then held for three hours at the increased temperature of 1400° C. The temperature was raised by two steps because the nitriding reaction of silicon is an exothermic reaction ($Si+2/3N_2=1/3Si_3N_4+64$ kJ) at 1400° C., and therefore, if the temperature was raised to 1400° C. at one time, the temperature exceeded 1400° C. because of its own heat, and the fusion of Si or the like occurred. After natural cooling, finish machining was performed by the use of an outer-periphery grinding machine and a surface grinding machine so as to have a size of 20 mm in diameter, 1 mm in height, 3 mm in length, 4 mm in width, and 40 mm in height. Using a sintered body subjected to the finish machining, respective characteristics were measured in the following way. Herein, it was confirmed according to X-ray diffraction that the metal Si did not remain in the sintered body, and all was $Si_3N_4$.

An apparent density was calculated from the size and weight of the sintered body, and a theoretical density was calculated from the added amount of sintering additive according to a mixing rule, and the whole porosity was calculated according to the following formula. (1−apparent density/theoretical density)×100(%).

The open pore volume was measured with a mercury porosimeter, and the closed-pore percentage was calculated according to the following formula. (whole pore volume−open pore volume)/whole pore volume×100(%).

Concerning the radii r1 and r2 of the adjoining pores and the thickness b of the ceramic part, the sintered body was cut, and, after grinding the section, an SEM observation was made. The center point of the pore was defined as a point serving as a two-dimensional gravity position by an SEM photograph, and, as shown in FIG. 1, the radii r1 and r2 of the pores and the thickness b of the ceramic part were measured by were connecting the center points of arbitrary adjoining pores to each other. Table I shows the average values of the measurement result of 50 points.

As electric characteristics, the permittivity and the dielectric loss (tan δ) at 30 GHZ were measured according to a measuring method prescribed in JIS R 1627. Table I shows these results.

TABLE I

| No. | Sintering condition | Whole porosity (%) | Closed-pore percentage (%) | (r1 + r2)/b | Permittivity | tan δ (×10⁻⁵) |
|---|---|---|---|---|---|---|
| 1 | 1200*3 + 1400*3 | 80 | 92 | 2.43 | 2.1 | 12 |
| 2 | 1300*3 + 1500 + 3 | 80 | 90 | 2.40 | 2.1 | 7 |
| 3 | 1300*3 + 1600 + 3 | 75 | 88 | 2.01 | 2.9 | 9 |

TABLE I-continued

| No. | Sintering condition | Whole porosity (%) | Closed-pore percentage (%) | (r1 + r2)/b | Permittivity | tan δ (×10⁻⁵) |
|---|---|---|---|---|---|---|
| 4 | 1300*3 + 1650 + 3 | 31 | 70 | 2.0 | 5 | 35 |
| 5* | 1300*3 + 1700 + 3 | 28 | 51 | 1.4 | 6.8 | 90 |
| 6* | 1300*3 + 1800 + 3 | 29 | 35 | 1.20 | 7.5 | 100 |

*comparative example

As can be understood from Table I, in the porous silicon nitride ceramics of the present invention, the porosity is 30% or more, i.e., the relative density is less than 70%, and the closed-pore percentage is 50% or more. It is understood that the porous silicon nitride ceramics gain high electrical characteristics, especially in dielectric-loss characteristics, by forming the ceramics as above. Additionally, it is understood that, when the sintering temperature was 1800° C., the hollow structure was changed into a dense one because of particle growth and phase transformations. Additionally, it is understood that, when the sintering temperature was 1200° C. to 1650° C., the value of (r1+r2)/b was 2 or more, and the dielectric loss was $12×10^{-5}$ or less, which are excellent results.

EXAMPLE 2

Si powder having the average particle diameter of 1 μm and, as sintering additives in the amount of 0.8 mol % with respect to the Si powder, rare-earth oxides as listed in Table II each having the average particle diameter of 0.8 μm were prepared. Each powder is commercially available. The Si-powder, whose oxygen content at the surface was pre-confirmed to be 0.7 mol % in terms of $SiO_2$, by measuring according to an inert-gas fusion and infrared detection method, was prepared. Each powder thus prepared was subjected to mixing, molding, and thermal treatment in the same way as in Example 1.

Thereafter, the atmosphere was changed to a nitrogen atmosphere of the atmospheric pressure. The temperature was then raised to 1000° C., and held for three hours, and then raised to 1200° C., and held for three hours. After natural cooling, finish machining was performed in the same way as in Example 1. The whole porosity, closed porosity, permittivity, and dielectric loss of each sintered body were measured in the same way as in Example 1. For measuring its mechanical characteristics, the finishing was made so as to have a strength-examination piece shape prescribed in JIS R 1601, and the three-point bend strength was measured according to the prescription. Table II shows these measurement results. Herein, it was confirmed according to X-ray diffraction that, in each sintered body, the metal Si did not remain, and all was $Si_3N_4$.

TABLE II

| No. | Kind of sintering additive | Whole porosity (%) | Closed-pore percentage (%) | (r1 + r2)/b | tan δ (×10⁻⁵) | Permittivity | Deflective strength (MPa) |
|---|---|---|---|---|---|---|---|
| 7* | $La_2O_3$ | 58 | 10 | 0 | 120 | 4.5 | 40 |
| 8* | $Nd_2O_3$ | 59 | 20 | 0.54 | 110 | 4.2 | 50 |
| 9 | $Sm_2O_3$ | 88 | 98 | 2.2 | 5 | 1.8 | 300 |
| 10 | $Er_2O_3$ | 80 | 90 | 1.8 | 20 | 3.0 | 200 |
| 11* | $Gd_2O_3$ | 65 | 45 | 1.2 | 70 | 4.1 | 190 |
| 12 | $Yb_2O_3$ | 78 | 99 | 2.61 | 6 | 2.5 | 300 |

TABLE II-continued

| No. | Kind of sintering additive | Whole porosity (%) | Closed-pore percentage (%) | (r1 + r2)/b | tan δ (×10$^{-5}$) | Permittivity | Deflective strength (MPa) |
|---|---|---|---|---|---|---|---|
| 13* | Al$_2$O$_3$ | 28 | 2 | 0 | 320 | 6.8 | 60 |
| 14* | Fe$_2$O$_3$ | 38 | <1 | 0 | 400 | 6.5 | 50 |

*comparative example

As can be understood from Table II, in the sintered body obtained by adding the sintering additive of the present invention, the porosity is 70% or more, i.e., the relative density is less than 30%, and the closed-pore percentage is 50% or more. It is understood that the sintered body is superior in electrical/mechanical characteristics, since the dielectric loss is $2 \times 10^{-4}$ or less, which is smaller than that of the conventional porous ceramics, and the deflective strength is 200 MPa or more.

In the porous silicon nitride ceramics, the value of (r1+r2)/b is 1 or more, and 2 or more, i.e., the pore diameter is two times or more as large as the thickness of the ceramic part, if a suitable sintering additive is selected. The pore diameter was 0.7 μm in the sample of No. 9, for example. As a result of the measurement of the quantity of leaks by the use of a helium detector, the quantity of leaks is $8 \times 10^{-9}$ atm·cc/sec in the sample of No. 9, $7 \times 10^{-7}$ in the sample of No. 10, and $5 \times 10^{-9}$ in the sample of No. 12, from which it was understood that hermetic sealing can be performed.

EXAMPLE 3

Si powder having the average particle diameter of 1 μm and, as sintering additives at the ratios shown in Table III with respect to the Si powder, Yb$_2$O$_3$ each having the average particle diameter of 0.8 μm were prepared. Each powder is commercially available. The Si-powder, whose oxygen content at the surface was pre-confirmed to be 0.7 mol % in terms of SiO$_2$ by measuring in the same manner as in Example 1, was prepared. Mixing, molding, sintering, and finishing were performed in the same manner as in Example 2. The whole porosity, closed-pore percentage, and dielectric loss of the obtained sintered bodies were measured in the same manner as in Example 1, and the results are shown in Table III.

TABLE III

| No. | Amount of addition (mol %) | Whole porosity (%) | Closed-pore percentage (%) | tan δ (×10$^{-5}$) |
|---|---|---|---|---|
| 15* | 0.16 | 65 | 30 | 100 |
| 16 | 0.78 | 67 | 98 | 9 |
| 17 | 2.5 | 50 | 85 | 20 |
| 18* | 6 | 42 | 45 | 220 |

*comparative example

From Table III, it is understood that, if the amount of addition of the sintering additive is less than 0.2 mol % or exceeds 2.5 mol %, the closed-pore percentage decreases, and the dielectric loss increases. In other words, if the amount of addition of the sintering additive is smaller, the hollowness of the Si particle is not sufficiently performed, and, if it is greater, particle growth is promoted, and the dosed-pore percentage decreases.

EXAMPLE 4

Si powders whose average particle diameter was 0.8 to 10 μm and, as a sintering additive, Sm$_2$O$_3$ having average particle diameter of 0.8 μm in the amount of 0.8 mol % with respect to the Si powder, were prepared. The oxygen content of each Si-powder at the surface was measured according to the method recited in Example 1, and the results (in terms of SiO$_2$) are shown in Table IV. Each powder is commercially available. Mixing, molding, sintering, and finishing were performed in the same manner as in Example 2 with these powders. In the sample of No. 22, an oxidation inhibitor was not added while ball-mill mixing was being performed. The whole porosity and closed-pore percentage of each sintered body were measured in the same manner as in Example 1, and the results are shown in Table IV. Grain boundary phases identified by X-ray diffraction are also shown in Table IV.

TABLE IV

| No. | Particle diameter (μm) | Surface oxygen content (mol %) | Whole porosity (%) | Closed-pore percentage (%) | Grain boundary phase |
|---|---|---|---|---|---|
| 19* | 10 | 0.17 | 65 | 21 | SmSiNO$_2$ |
| 20 | 4 | 0.5 | 82 | 92 | Sm$_{10}$N$_2$(SiO$_4$)$_6$ |
| 21 | 1 | 0.9 | 72 | 99 | Sm$_4$Si$_2$N$_2$O$_7$ |
| 22* | 1 | 0.9 | 52 | 45 | Sm$_2$Si$_3$N$_4$O$_3$ |
| 23* | 0.8 | 3.0 | 40 | 10 | Sm$_2$Si$_3$N$_4$O$_3$ |

*comparative example

In a comparison between the sample of No. 21 and that of No. 22, both of which used the same raw material of Si powder, in No. 22 the oxygen content of the metal Si powder increased to 1.7 mol % after ball-mill mixing since no oxidation inhibitor was added. From this fact and from Table IV, it is understood that, if the oxygen content of the metal Si powder is less than 0.2 mol % or exceeds 1.0 mol %, the composition of a grain boundary phase becomes different from that of a grain boundary phase to be sought in the present invention, and therefore the whole porosity is reduced, and the closed-pore percentage decreases. This is caused probably because the composition of the grain boundary phases is different, and reactive forms are different, and the hollowing of the metal Si is not promoted.

EXAMPLE 5

Si powder and Er$_2$O$_3$ powder, which are the same as those of Example 1, were prepared. Mixing and molding were performed in the same manner as in Example 1 with these powders. As in Example 1, it was held for one hour at 950° C., and a molded piece was sintered under the conditions of Table V by carbon-heater heating under a nitrogen atmosphere of atmospheric pressure. The sintering conditions are the same as those of Example 1. The finishing of the sintered body was performed in the same manner as in Example 1. The whole porosity, closed-pore percentage, (r1+r2)/b value, and dielectric loss of each sintered body were measured in the same manner as in Example 1, and the results are shown in Table V. The (r1+r2)/b value is an average value of the measurement results of 50 points.

TABLE V

| No. | Sintering condition | Whole porosity (%) | Closed-pore percentage (%) | (r1 + r2)/b | tan δ (×10⁻⁵) |
| --- | --- | --- | --- | --- | --- |
| 24 | 1300*3 + 1500*3 | 50 | 65 | 1.2 | 100 |
| 25 | 1000*3 + 1200*3 | 55 | 70 | 1.8 | 80 |
| 26* | 1300*3 + 1800*3 | 15 | 30 | 0.54 | 160 |

*comparative example

From Table V, it is understood that, if the sintering temperature is 1800° C., the hollow structure is changed into a dense structure because of particle growth and phase transformations. Additionally, by a comparison between Table I and Table V, it is understood that microwave heating brings about a higher closed-pore percentage and brings about a lower dielectric loss. The reason is presumably because microwaves can perform more efficient heating, and the diffusional reaction to the outer shell (silicon nitride) of the metal Si is further promoted.

INDUSTRIAL APPLICABILITY

According to the present invention, it is possible to obtain porous silicon nitride ceramics that are higher in the ratio of closed pores and that have more uniformly-dispersed closed pores than other materials and conventional methods. Since the porous silicon nitride ceramics of the present invention have a high ratio of closed pores and are superior in electrical/mechanical characteristics, excellent characteristics can be displayed if they are used for example, an electronic circuit board that requires an anti-hygroscopicity, a low dielectric constant, a low dielectric loss, and mechanical strength.

The invention claimed is:

1. Porous silicon nitride ceramics wherein a relative density is less than 70%, the ratio of closed pores to all pores is 50% or more, the average diameter of the closed pores is not less than 0.1 μm and not more than 15 μm, and
the relation (r1+r2)/b>1 is established in an arbitrary section where r1 and r2 are radii of two adjoining pores, and b is a width of a ceramic part.

2. A silicon-nitride ceramic circuit board wherein at least a part of insulating layers consists of the silicon nitride ceramic material according to claim 1.

3. Porous silicon nitride ceramics which contains an oxynitride or a silicon oxynitride compound crystal phase represented as $RE_4Si_2N_2O_7$, or $RE_{10}N_2(SiO_4)_6$, wherein: RE is a rare earth metal; and a relative density is less than 70%, the ratio of closed pores to all pores is 50% or more, and the average diameter of the closed pores is not less than 0.1 μm and not more than 15 μm.

4. A silicon-nitride ceramic circuit board wherein at least a part of insulating layers consists of the silicon nitride ceramic material according to claim 3.

5. A method for manufacturing a porous silicon nitride ceramic, comprising the steps of:
   forming a molded piece that contains a metal Si powder and a compound powder of at least one of Yb, Sm, and Er of 0.2 to 2.5 mol % with respect to the metal Si powder; and
   heating the molded piece at 800° C. or more and less than 1,000° C. and thereafter nitriding the molded piece at 1,000° C. or more.

6. A method for manufacturing a porous silicon nitride ceramic according to claim 5, wherein the molded piece is subjected to thermal treatment under micro-wave irradiation or millimeter-wave irradiation such that silicon nitride ceramic particles contained therein are hollowed so as to produce the porous silicon nitride ceramic.

7. A method for manufacturing a porous silicon nitride ceramic according to claim 5, wherein a grain boundary phase including $RE_{10}N_2(SiO_4)_6$ or $RE_4Si_2N_2O_7$ is formed by heating at 800° C. or more and less than 1,000° C.

* * * * *